(12) United States Patent
Kuhn et al.

(10) Patent No.: US 9,130,135 B2
(45) Date of Patent: Sep. 8, 2015

(54) OPTOELECTRONIC SEMICONDUCTOR COMPONENT

(75) Inventors: Gerhard Kuhn, Köfering (DE); Ales Markytan, Regensburg (DE); Christian Gärtner, Regensburg (DE); Ulrich Streppel, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 13/988,005

(22) PCT Filed: Jan. 27, 2012

(86) PCT No.: PCT/EP2012/051377
§ 371 (c)(1),
(2), (4) Date: Jul. 22, 2013

(87) PCT Pub. No.: WO2012/119812
PCT Pub. Date: Sep. 13, 2012

(65) Prior Publication Data
US 2013/0285081 A1    Oct. 31, 2013

(30) Foreign Application Priority Data

Mar. 9, 2011 (DE) .......................... 10 2011 013 370

(51) Int. Cl.
| H01L 29/18 | (2006.01) |
| H01L 33/60 | (2010.01) |
| H01L 33/58 | (2010.01) |
| H01L 25/075 | (2006.01) |
| F21V 13/04 | (2006.01) |

(Continued)

(52) U.S. Cl.
CPC ................ H01L 33/60 (2013.01); H01L 33/58 (2013.01); F21V 13/04 (2013.01); F21Y 2101/02 (2013.01); F21Y 2113/005 (2013.01); H01L 25/0753 (2013.01)

(58) Field of Classification Search
CPC ..... H01L 33/60; H01L 33/58; H01L 25/0753; F21V 13/04; F21Y 2101/02; F21Y 2113/005; F21Y 101/02
USPC ......... 257/13, 79, E27.133, E33.076, 88–103
See application file for complete search history.

(56) References Cited

U.S. PATENT DOCUMENTS

| 5,946,508 A * | 8/1999 | Ito .................................. 396/297 |
| 2004/0126674 A1* | 7/2004 | Taniguchi et al. ................ 430/5 |
| 2006/0263921 A1* | 11/2006 | Nakamura et al. .............. 438/34 |

(Continued)

FOREIGN PATENT DOCUMENTS

| EP | 2 233 819 A1 | 9/2010 |
| JP | 2009-099926 A | 5/2009 |

(Continued)

*Primary Examiner* — Yosef Gebreyesus
(74) *Attorney, Agent, or Firm* — Slater & Matsil, L.L.P.

(57) ABSTRACT

An optoelectronic semiconductor component, includes at least two optoelectronic semiconductor chips, which are located on a common mounting surface. An optical element is arranged downstream of the semiconductor chips in a main emission direction and is spaced from the semiconductor chips. In a direction transverse to the main emission direction the optical element has a transmission gradient in a transitional region. The transitional region does not overlap the semiconductor chips, when viewed in plan view onto the mounting surface.

23 Claims, 4 Drawing Sheets

(51) Int. Cl.
*F21Y 101/02* (2006.01)
*F21Y 113/00* (2006.01)

(56) References Cited

U.S. PATENT DOCUMENTS

2008/0283864 A1* 11/2008 LeToquin et al. ............ 257/101
2009/0025275 A1* 1/2009 Cohnstaedt et al. ............ 43/113
2012/0193649 A1* 8/2012 Donofrio et al. ................ 257/88

FOREIGN PATENT DOCUMENTS

| JP | 2011-044418 A | 3/2011 |
| WO | WO 2010/146516 A1 | 12/2010 |
| WO | WO 2011/125009 A1 | 10/2011 |

* cited by examiner

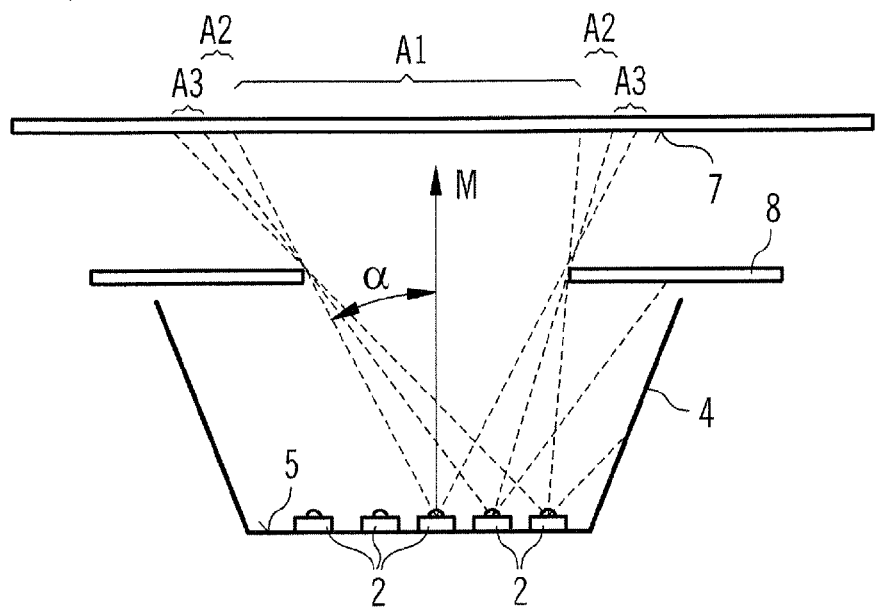
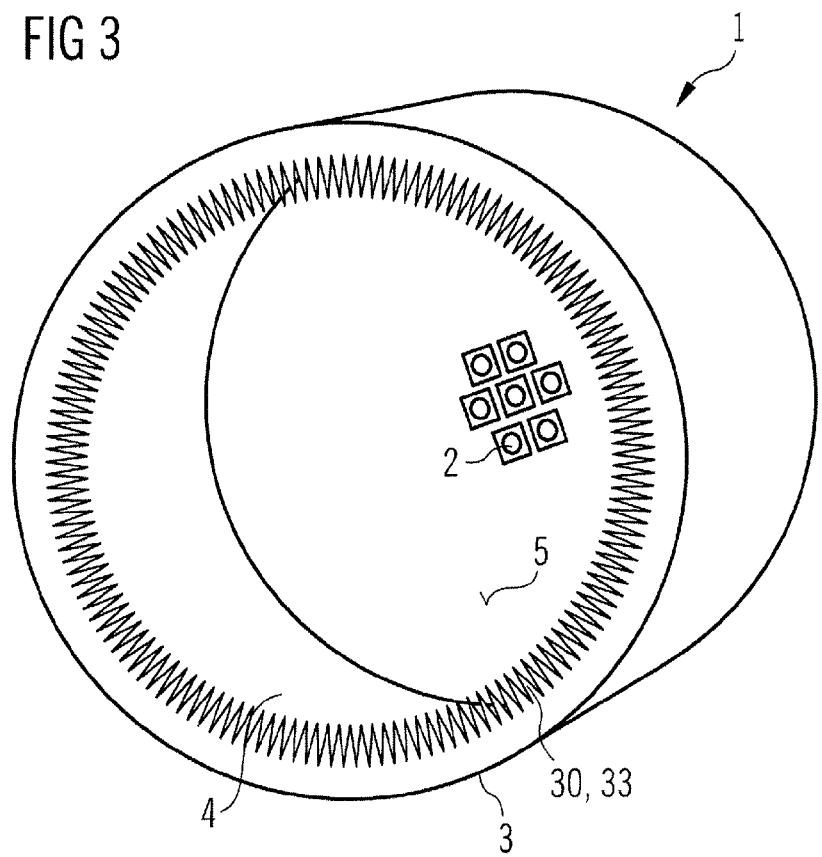

OPTOELECTRONIC SEMICONDUCTOR COMPONENT

This patent application is a national phase filing under section 371 of PCT/EP2012/051377, filed Jan. 27, 2012, which claims the priority of German patent application 10 2011 013 370.4, filed Mar. 9, 2011, each of which is incorporated herein by reference in its entirety.

TECHNICAL FIELD

An optoelectronic semiconductor component is provided.

SUMMARY OF THE INVENTION

Embodiments provide an optoelectronic semiconductor component in which gradations in brightness are reduced or eliminated in a region illuminated by the semiconductor component.

According to at least one embodiment, a semiconductor component includes at least two optoelectronic semiconductor chips. The semiconductor component preferably comprises between 5 and 20 semiconductor chips inclusive. The semiconductor chips preferably comprise light-emitting diodes, or LEDs for short. The semiconductor chips are located on a common mounting surface of the semiconductor component. The mounting surface is, for example, a continuous, planar surface, to which the semiconductor chips are electrically and thermally attached. The mounting surface is formed partially or completely, for example, by a lead frame and/or by a bottom face of a reflector.

According to at least one embodiment of the semiconductor component, the latter comprises an optical element. The optical element is arranged downstream of the semiconductor chips in a main emission direction of the semiconductor component or in a main emission direction of at least one of the semiconductor chips. The main emission direction is in particular a direction in which the maximum intensity of the radiation emitted by at least one of the semiconductor chips or of the radiation emitted by the entire semiconductor component is emitted. Furthermore, the optical element is spaced from the semiconductor chips. The optical element is thus not in direct, immediate contact with a light exit face of the semiconductor chips.

According to at least one embodiment of the optoelectronic semiconductor component, the optical element has a transmission gradient in a transitional region in a direction transverse to the main emission direction, preferably in a direction perpendicular to the main emission direction. Transmission gradient means that a transmission or transmittance of the optical element varies in the transitional region. Transmittance is here the quotient of the radiation transmitted by the optical element at a given point and the radiation impinging at this point of the optical element from the semiconductor chips. Transmittance can also be designated transmission factor. The transmission gradient preferably takes the form of a gradient in the diffuse or specular reflection or of a gradient in the absorption of the optical element. The width of the transitional region preferably amounts to at least 0.5 mm or at least 1 mm.

According to at least one embodiment of the optical element, the transitional region, when viewed in plan view onto the mounting surface, is located next to the semiconductor chips. The transitional region thus does not cover the semiconductor chips, preferably in a parallel projection to the main emission direction.

In at least one embodiment of the optoelectronic semiconductor component, the latter comprises at least two optoelectronic semiconductor chips, which are located on a common mounting surface. One optical element of the semiconductor component is arranged downstream of the semiconductor chips in a main emission direction and is spaced from the semiconductor chips. In a direction transverse to the main emission direction the optical element exhibits a transmission gradient in a transitional region. The transitional region does not overlap the semiconductor chips, when viewed in plan view onto the mounting surface.

The transmission gradient in the transitional region of the optical element allows brightness gradations at a surface illuminated by the semiconductor component to be avoided or reduced.

According to at least one embodiment of the semiconductor component, the optical element is not an optical element based on refraction. In other words, the optical element does not perform beam-shaping by way of refraction. In particular, the optical element is then not a lens such as a convergent lens, diverging lens, microlens or Fresnel lens. The optical element may be formed of a plane parallel plate, into which reflective or absorptive materials have been introduced or which is provided with such materials on one or two major sides.

According to at least one embodiment of the semiconductor component, the transitional region surrounds a central region of the optical element. The fact that the transitional region surrounds the central region may mean that the central region is completely surrounded by the transitional region, for example, over a constant or approximately constant width. In other words, the transitional region may exhibit a constant width, with a tolerance of at most 25% or of at most 10% relative to an average width, in projection onto a plane perpendicular to the main emission direction.

According to at least one embodiment of the semiconductor component, a transmittance or an average transmittance in the central region amounts, for radiation emitted by the semiconductor chips, to at least 80% or at least 90% or at least 95%. In other words, in the central region the optical element is completely or virtually completely pervious to radiation emitted by the semiconductor chips. The central region of the optical element is formed, for example, of a transparent glass sheet or transparent plastics sheet or indeed of a recess or a hole. Transmittance is particularly preferably constant or approximately constant over the entire central region.

According to at least one embodiment of the semiconductor component, the transmittance decreases monotonically or strictly monotonically in the transitional region, in a direction away from the central region. Radiation-transmissibility thus decreases radially towards the outside in the transitional region. At an outer edge of the transitional region furthest away from the central region, transmittance preferably amounts to at most 20% or at most 10% or at most 5%. At the outer edge of the transitional region, the optical element is particularly preferably impervious to radiation emitted by the semiconductor chips when in operation.

According to at least one embodiment of the semiconductor component, the semiconductor chips are located in a reflector, a bottom surface of the reflector forming the mounting surface. Side walls of the reflector take the form, for example, of a truncated cone or a truncated pyramid, are cylindrical or are shaped like a parabola. The optical element is located, for example, on a side of the reflector opposite the bottom surface and/or completely or partially covers the reflector.

According to at least one embodiment of the semiconductor component, the transitional region annularly surrounds the semiconductor chips when viewed in plan view onto the mounting surface. When viewed in plan view, the distance between the semiconductor chips and the transitional region amounts, for example, to at least the average diagonal length of the light exit face of the semiconductor chips.

According to at least one embodiment of the semiconductor component, the optical element comprises a stop (also referred to as diaphragm or aperture) or the optical element is a stop. The stop has an average stop opening diameter. Both the central region and the transitional region are located within the stop opening diameter, in particular in each case completely. The following applies for the average stop opening diameter D and for the average width H of the transitional region: $4 \leq D/H \leq 40$ or $7 \leq D/H \leq 25$.

According to at least one embodiment of the semiconductor component, said component does not emit any of the radiation generated by the semiconductor chips outside the transitional region. In other words, radiation emission from the semiconductor component takes place solely in the central region and in the transitional region.

According to at least one embodiment of the semiconductor component, all the semiconductor chips are inscribed in a surface region of the mounting surface. The surface region is, for example, circular, square or rectangular in shape. A square or a rectangle of minimum size, into which all the semiconductor chips may be inscribed, preferably has a size of at least 3 mm×3 mm and/or of at most 20 mm×20 mm. Alternatively or additionally, the following applies for the average stop opening diameter D and for an average surface region diameter d of the surface region: $3 \leq D/d \leq 30$.

According to at least one embodiment of the semiconductor component, the following applies for an average distance T between the optical element and the light exit faces, facing the optical element, of the semiconductor chips and for the average stop opening diameter D: $0.25 \leq D/T \leq 6$ or $1 \leq D/T \leq 5$.

According to at least one embodiment of the semiconductor component, in the transitional region transmittance decreases towards the outside in a linear manner, in particular down to zero. In other words, the transmission gradient is constant in the transitional region.

According to at least one embodiment of the semiconductor component, in the transitional region transmittance decreases in a stepped manner, in a direction away from the central region, in particular down to zero. With regard to transmittance, the transitional region here comprises a plurality of steps. Within a step transmittance is constant or approximately constant. The transmittances of adjacent steps differ from one another preferably by at most 20 percentage points or by at most 15 percentage points or by at most 10 percentage points. For example, the transitional region comprises at least five or at least eight or at least twelve such steps with regard to transmittance.

According to at least one embodiment of the semiconductor component, the transitional region comprises triangular teeth when viewed in plan view. In the teeth transmittance is preferably constant or approximately constant. The transmittance of the triangular teeth preferably amounts to at most 20% or at most 10% or at most 5%. In particular, the teeth are impervious to radiation generated by the semiconductor chips when in operation. The width of the teeth in each case increases towards the outside, in a direction away from the central region.

According to at least one embodiment of the semiconductor component, the following applies for a maximum width B of the teeth and for the average width H of the transitional region: $0.5 \leq H/B \leq 5$.

According to at least one embodiment of the semiconductor component, the transmission gradient in the transitional region is dependent on a wavelength of the radiation emitted by the semiconductor chip. It is possible for the transitional region to have a transmission gradient for just one spectral sub-range of the radiation emitted by the semiconductor chips and for transmittance to be approximately constant over the entire transitional region for other spectral ranges of the radiation emitted by the semiconductor chips.

According to at least one embodiment of the semiconductor component, when in operation the semiconductor chips emit radiation in at least two different wavelength ranges. The semiconductor component comprises, for example, one or more semiconductor chips which emit blue light and/or white light or greenish-white light, and one or more semiconductor chips which emit yellow light and/or red light. The semiconductor component in particular comprises precisely two types of semiconductor chip emitting in different spectral ranges.

According to at least one embodiment of the semiconductor component, all the semiconductor chips, with the exception of precisely one semiconductor chip, emit radiation in the same wavelength range when in operation. The semiconductor component in particular comprises precisely one semiconductor chip emitting in the red spectral range and otherwise at least two semiconductor chips emitting in the white spectral range or in the greenish-white spectral range.

According to at least one embodiment of the semiconductor component, the precisely one semiconductor chip emitting in a different color is arranged centrally on the mounting surface relative to the other semiconductor chips. The semiconductor chip emitting in a different color when in operation is in particular surrounded regularly by the further semiconductor chips. The distance between the semiconductor chip emitting in a different color and the transitional region is thus greater than the distance between the further semiconductor chips and the transitional region, when viewed in a plan view onto the semiconductor component.

According to at least one embodiment of the semiconductor component, the semiconductor chips are arranged in a regular pattern on the mounting surface. The pattern comprises, for example, a hexagonal grid or a rectangular or square grid.

According to at least one embodiment of the semiconductor component, an average emission angle of at least one of the semiconductor chips or of the plurality of semiconductor chips or of all the semiconductor chips amounts to at least 120° or at least 135° or at least 150°. The average emission angle is here a minimum, continuous angular range, in which 50% of the radiant intensity is emitted when viewed in a given section plane. The average emission angle is thus related to the full width at half maximum, or FWHM for short. The semiconductor chips are then preferably not "Lambertian emitters." The semiconductor chips preferably emit with a greater average emission angle than is the case for a Lambertian emitter. For a Lambertian emitter the intensity I emitted in one direction is equal to a maximum intensity $I_0$ times the cosine of the angle β to the perpendicular of the light exit face of the semiconductor chip:

$$I(\beta) = I_0 \cos \beta.$$

According to at least one embodiment of the semiconductor component, at least one of the semiconductor chips is or the semiconductor chips are "Lambertian emitters." In particular, the relationship $I(\beta) = I_0 \cos \beta$ applies, preferably with a tolerance of at most 0.05 $I_0$.

According to at least one embodiment of the semiconductor component, the average stop opening diameter is between 20 mm and 120 mm inclusive, in particular between 40 mm and 100 mm inclusive. The average distance between the optical element and the light exit face of the semiconductor chip is alternatively or additionally between 20 mm and 80 mm inclusive or between 25 mm and 50 mm inclusive. The average width of the transitional region amounts alternatively or additionally to between 1 mm and 10 mm inclusive or between 3 mm and 7 mm inclusive.

BRIEF DESCRIPTION OF THE DRAWINGS

An optoelectronic semiconductor component described here is explained in greater detail below by way of exemplary embodiments and with reference to the drawings. Elements which are the same in the individual figures are indicated with the same reference numerals. The relationships between the elements are not shown to scale, however, but rather individual elements may be shown exaggeratedly large to assist in understanding.

FIGS. 1A, 1B, 3, 4A and 4B are schematic representations of exemplary embodiments of semiconductor components described here;

FIG. 2 is a schematic sectional representation of a conventional semiconductor component;

FIG. 7, which includes

DETAILED DESCRIPTION OF ILLUSTRATIVE EMBODIMENTS

Figure 1A:
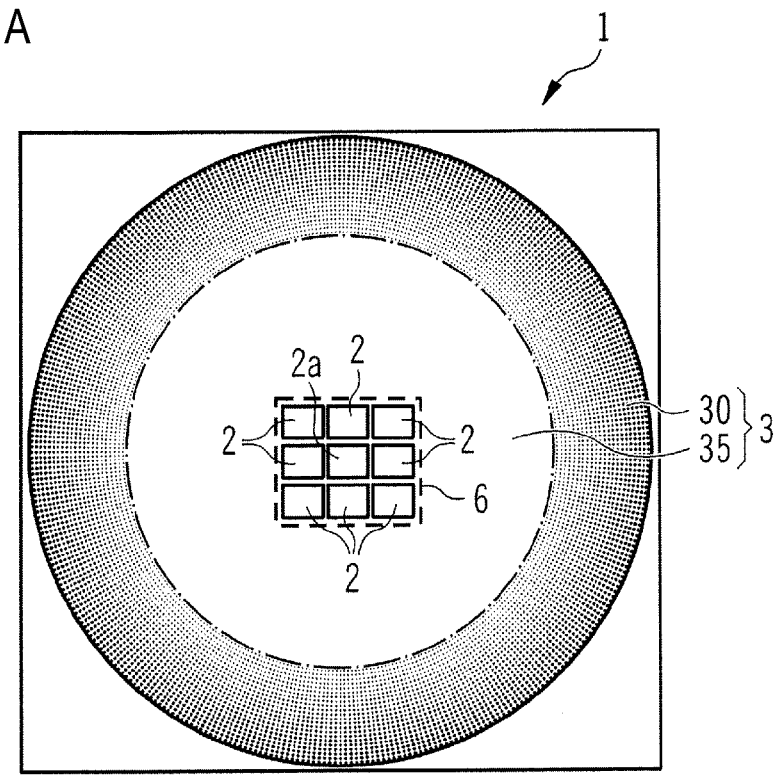
Figure 1B:
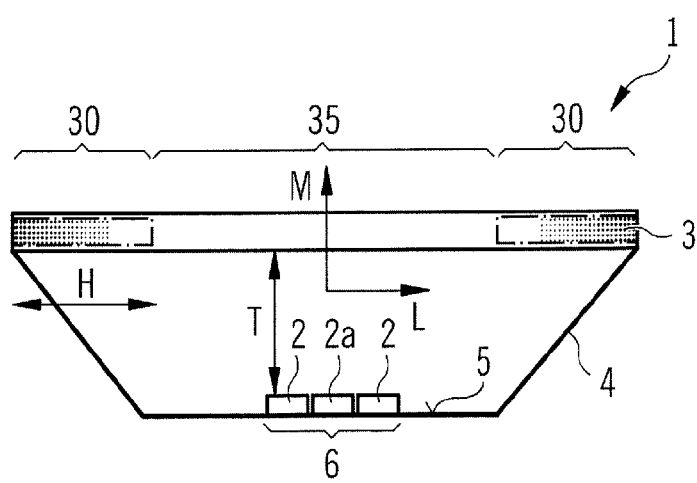

FIG. 1A is a schematic plan view and FIG. 1B is a schematic sectional representation of an exemplary embodiment of an optoelectronic semiconductor component 1 described here. The semiconductor component 1 comprises a reflector 4, the bottom surface of which forms a mounting surface 5 for optoelectronic semiconductor chips 2, 2a. The semiconductor chips 2, 2a are mounted on the mounting surface 5 in a square surface region 6. The surface region 6 has a size of between 3 mm×3 mm and 20 mm×20 mm inclusive. The semiconductor chips 2, 2a are arranged in a matrix in the surface region 6. The reflector 4 takes the form of a truncated cone when viewed in cross-section.

On a side opposite the mounting surface 5, the reflector 4 is covered by an optical element 3. The optical element 3 is at a distance T from light exit faces of the semiconductor chips 2, 2a facing the optical element 3, which distance T exceeds an average length of diagonals of the light exit faces of the semiconductor chips 2, 2a preferably by at least a factor of 10. The optical element 3 comprises a central region 35, which is surrounded by a transitional region 30 with a constant width H. The transitional region 30 surrounds the semiconductor chips 2, 2a completely and does not overlap the semiconductor chips 2, 2a when viewed in plan view.

The optical element 3 is oriented perpendicular to a main emission direction M of the semiconductor component 1 and thus parallel to the mounting surface 5. In a lateral direction L, transverse to the main emission direction M, the transmittance of the optical element 3 decreases continuously towards the outside in the transitional region 30. In the transitional region 30 the absorptivity of the optical element 3 or preferably, on a side facing the semiconductor chips 2, 2a, the reflectivity of the optical element 3 increases steadily towards the outside, away from the central region 35. In the central region 35 the optical element 3 is transparent and does not have a beam-shaping action.

The semiconductor chips 2 which are arranged around the central semiconductor chip 2a are optionally semiconductor chips of identical construction and emitting in the same spectral range, for example, light-emitting diodes emitting white or greenish-white light. The central semiconductor chip 2a is, for example, a light-emitting diode emitting in the red spectral range.

FIG. 2 is a schematic sectional representation of a conventional semiconductor component. On the mounting surface 5 of the reflector 4 a plurality of semiconductor chips 2 are mounted, which emit radiation in the main emission direction M with an average emission angle α when in operation. The reflector 4 is covered by a cover plate 8 with a central aperture. In the region of the aperture, the cover plate 8 is completely transparent to radiation emitted by the semiconductor chips 2, while around the aperture the cover plate 8 is completely impervious to radiation in the visible spectral range.

Certain directional components of the radiation emitted by the semiconductor chips 2 are sharply cut off by the cover plate 8. This results in different illumination regions A1, A2, A3 on one surface 7 illuminated by the semiconductor component. Radiation from all the semiconductor chips 2 reaches the illumination region A1. Only the radiation from some of the semiconductor chips 2 reaches each of the illumination regions A2, A3. Because the cover plate 8 does not comprise a transitional region with a transmission gradient, the annular illumination regions A2, A3 of lower illumination intensity arise around the central illumination region A1.

The different illumination regions A2, A3 are delimited comparatively sharply from one another by brightness transitions and may cause patterns which are irritating for an observer. These troublesome, sharp transitions between different illumination regions A1, A2, A3 can be avoided or at least greatly reduced by the optical element 3, as shown for instance in FIG. 1. The development of gradations in brightness is thus stopped or greatly reduced by such an optical element 3.

Such mutually separated illumination regions could also be avoided by using a single semiconductor chip. However, just a single semiconductor chip limits illumination intensity. When using a diffuser close to the semiconductor chips to reduce gradations in brightness, only a Lambertian emission pattern can be achieved, with a comparatively small average emission angle of typically at most 120°. In addition a comparatively deep reflector is needed to avoid glare. By using an optical element developed as described, a plurality of semiconductor chips may be used and it is possible to dispense with a diffuser. At the same time, it is possible to achieve a greater emission angle.

FIG. 3 is a perspective representation of a further exemplary embodiment of the semiconductor component 1. Seven semiconductor chips 2 are located on the mounting surface 5, arranged in a regular hexagonal pattern. The reflector 4 is tubular in shape. The optical element 3 comprises a plurality of triangular teeth 33 in the transitional region 30. The teeth 33 are shaped from a radiation-impervious material. On a side facing the semiconductor chips 2 the teeth 33 are preferably reflective. In the transitional region 30 the area of the teeth 33 increases steadily towards the outside. In this way, the transmittance in the transitional region decreases continuously towards the outside. It is possible for the teeth 33 to have rounded corners when viewed in plan view, unlike in the illustration.

Figure 4A:
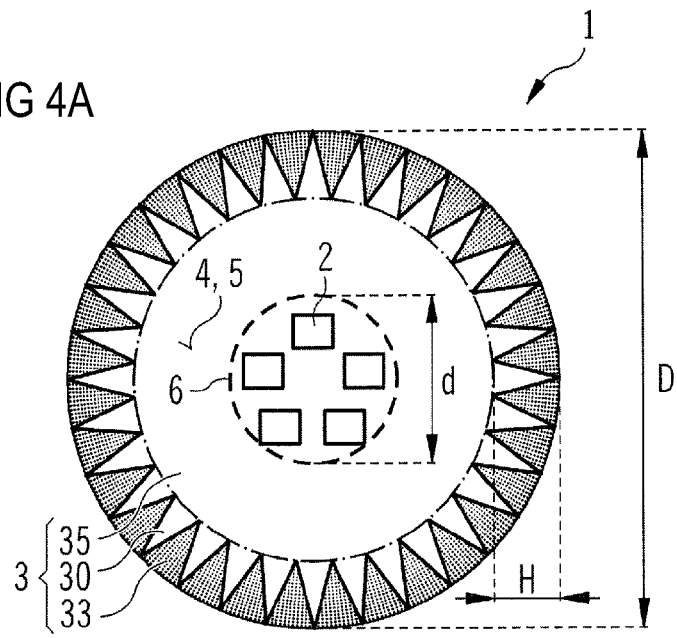
Figure 4B:
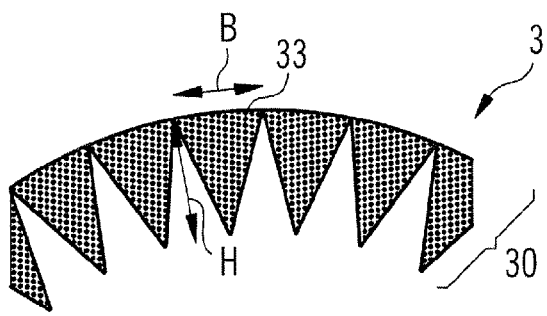

FIG. 4A is a plan view and FIG. 4B is a detail view of a further exemplary embodiment of the semiconductor component 1 with an optical element 3 shaped with the teeth 33. The following preferably applies for an average width H of the transitional region 30 and for a maximum width B of the teeth 33: 0.5≤H/B≤5. The semiconductor chips 2 are arranged in a regular pentagon within the surface region 6. The surface region 6 has an average surface region diameter d, in which all the semiconductor chips 2 are inscribed.

The optical element 3 with the circular central region 35 and the circular ring-shaped transitional region 33 has an average stop opening diameter D of around 60 mm, for example. The stop opening diameter D describes the average diameter up to which an average transmittance, relative to a distance from the central region 35, has returned to zero in the transitional region 30.

Figure 5:
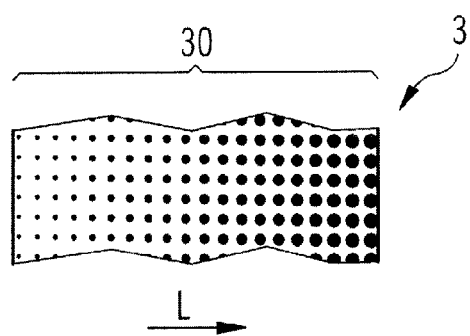
FIGS. 5 and 6 are schematic representations of optical elements for semiconductor components described here.

According to FIG. 1, the transitional region 30 takes the form of a grey wedge, in which transmittance decreases continuously towards the outside. According to FIGS. 3 and 4, the transitional region takes the form of a tooth-like structure, in which a proportion of an opaque material increases in linear manner in a direction away from the central region 35. In the exemplary embodiment according to FIG. 5, the optical element 3 is formed of a transparent material, on which regions are applied, for example, imprinted, which are opaque in the transitional region 30. The proportion of opaque regions, which are insular in form, increases towards the outside in the lateral direction L. In this way, an approximately continuous profile or a stepped profile may be achieved for the transmittance in the lateral direction L.

Figure 6:
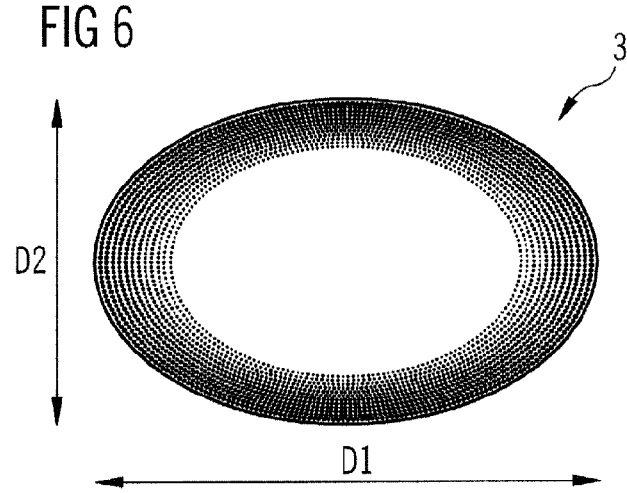

The optical element 3 according to FIG. 6 is elliptical in shape, when viewed in plan view. A quotient of the lengths of a longitudinal axis D1 and a short axis D2 is preferably between 1.05 and 2 inclusive, in particular between 1.05 and 1.5 inclusive. Such an optical element 3 enables the production of semiconductor components, for example, for illuminating elongate areas, for instance corridors in buildings. Unlike as is shown in the Figures, it is also possible to form rectangular or square transitional regions instead of a circular or elliptical transitional region.

Figure 7A:
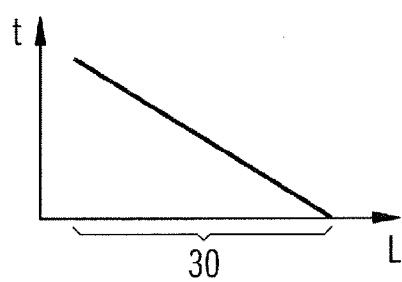
FIGS. 7A-7C, shows schematic representations of the transmission gradient of optical elements for semiconductor components described here.
Figure 7B:
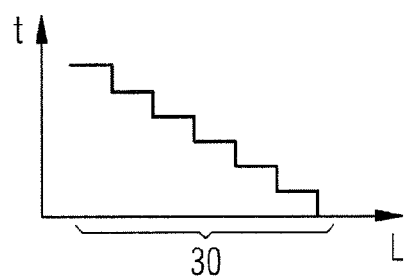
Figure 7C:
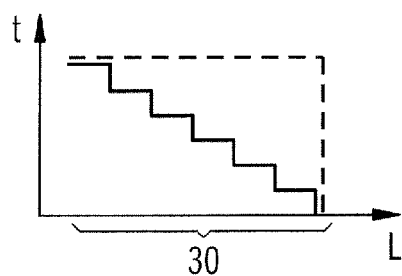

FIG. 7 plots the transmittance t in the transitional region 30 in the lateral direction L. According to FIG. 7A, the transmittance t decreases in a linear manner towards the outside, cf. in particular the exemplary embodiments according to FIG. 1, 3, 4 or 6. FIG. 7B shows a stepped decrease in the transmittance t in the lateral direction L, for example, as may be obtained with an embodiment of the optical element 3 similar to FIG. 5.

If the semiconductor component 1 comprises two or more types of semiconductor chip 2, which emit radiation in different spectral ranges, it is possible for the transmittance t to have a linear or stepped profile in the transitional region 30 for radiation from just some of the semiconductor chips 2, for instance, in exemplary embodiments based on FIG. 1. The stepped profile of the transmittance t is shown as continuous line in FIG. 7C. For radiation emitted by other semiconductor chips 2a the transmittance t may then be constant in the transitional region 30 and return abruptly to zero or approximately to zero at an outer edge of the transitional region 30, cf. the dashed line in FIG. 7C.

The invention described here is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic semiconductor component comprising:
    a plurality of optoelectronic semiconductor chips located on a common mounting surface; and
    an optical element arranged downstream of the semiconductor chips in a main emission direction and spaced from the semiconductor chips;
    wherein the optical element has a transmission gradient in a transitional region in a direction transverse to the main emission direction and wherein the transitional region does not overlap the semiconductor chips when viewed in plan view onto the mounting surface; and
    wherein, in a central region of the optical element, a transmittance for radiation emitted by the semiconductor chips amounts to at least 80% and in the transitional region the transmittance decreases monotonically or strictly monotonically in a direction away from the central region and amounts to at most 20% at an outer edge of the transitional region.

2. The optoelectronic semiconductor component according claim 1, wherein the transitional region surrounds a central region of the optical element.

3. The optoelectronic semiconductor component according claim 1, wherein the transmission gradient is dependent on a wavelength of radiation emitted by the semiconductor chips;
    wherein the semiconductor component comprises precisely two types of semiconductor chips emitting in different spectral ranges; and
    wherein the transmittance decreases in the transitional region in a linear or stepped manner towards the outside for at least one of the wavelengths.

4. The optoelectronic semiconductor component according to claim 1,
    wherein the semiconductor chips are located in a reflector and a bottom surface of the reflector forms the mounting surface, and
    wherein the transitional region, when viewed in plan view onto the mounting surface, surrounds the semiconductor chips annularly.

5. The optoelectronic semiconductor component according to claim 1, wherein the optical element comprises a stop, wherein the following applies for an average stop opening diameter D and for an average width H of the transitional region: 4≤D/H≤40.

6. The optoelectronic semiconductor component according claim 5, wherein the following applies for the average stop opening diameter D and for an average surface region diameter d within which the semiconductor chips are arranged: 3≤D/d≤30.

7. The optoelectronic semiconductor component according to claim 5, wherein the following applies for an average distance T between the optical element and the light exit faces, facing the optical element, of the semiconductor chips and for the average stop opening diameter D: 0.25≤D/T≤6.

8. The optoelectronic semiconductor component according to claim 5,
    wherein the semiconductor chips are located in a reflector and a bottom surface of the reflector forms the mounting surface,
    wherein the average stop opening diameter is between 20 mm and 120 mm inclusive,
    wherein the average distance between the optical element and the light exit face of the semiconductor chips is between 20 mm and 80 mm inclusive, and wherein the average width of the transitional region amounts to between 1 mm and 10 mm inclusive, wherein the optical element at least partially overlaps the reflector.

9. The optoelectronic semiconductor component according claim 1, wherein all the semiconductor chips are inscribed in a surface region of the mounting surface of at least 3 mm×3 mm and of at most 20 mm×20 mm.

10. The optoelectronic semiconductor component according to claim 1, wherein the transmittance decreases in the transitional region in a linear manner towards the outside.

11. The optoelectronic semiconductor component according to claim 1, wherein the transmittance decreases in a stepped manner in the transitional region, the transitional region comprising a plurality of transmittance steps and the transmittance of adjacent steps differing by at most 20 percentage points.

12. The optoelectronic semiconductor component according to claim 1, wherein the transitional region, when viewed in plan view, comprises triangular teeth with a transmittance of at most 20%, wherein the width of each of the teeth increases towards the outside.

13. The optoelectronic semiconductor component according to claim 12, wherein the following applies for a maximum width B of the teeth and for an average width H of the transitional region: $0.5 \leq H/B \leq 5$.

14. The optoelectronic semiconductor component according to claim 1,
wherein the transmission gradient is dependent on a wavelength of radiation emitted by the semiconductor chips, and
wherein the semiconductor chips emit in at least two different wavelength ranges when in operation.

15. The optoelectronic semiconductor component according to claim 14,
wherein all the semiconductor chips, with the exception of precisely one semiconductor chip, emit radiation in the same wavelength range when in operation,
wherein the semiconductor chip emitting in a different wavelength range is arranged centrally on the mounting surface relative to the other semiconductor chips.

16. The optoelectronic semiconductor component according to claim 1,
wherein the plurality of semiconductor chips comprises between 5 and 20 semiconductor chips inclusive, and
wherein the semiconductor chips are arranged in a regular pattern on the mounting surface.

17. The optoelectronic semiconductor component according to claim 1, wherein an average emission angle of at least one of the semiconductor chips amounts to at least 120°.

18. An optoelectronic semiconductor component comprising:
a plurality of optoelectronic semiconductor chips located on a common mounting surface; and
an optical element arranged downstream of the semiconductor chips in a main emission direction and spaced from the semiconductor chips;
wherein the optical element has a transmission gradient in a transitional region in a direction transverse to the main emission direction and wherein the transitional region does not overlap the semiconductor chips when viewed in plan view onto the mounting surface;
wherein the transmission gradient is dependent on a wavelength of radiation emitted by the semiconductor chips;
wherein the semiconductor component comprises precisely two types of semiconductor chips emitting in different spectral ranges; and
wherein the transmittance of the optical element decreases in the transitional region in a linear or stepped manner towards the outside for at least one of the wavelengths.

19. An optoelectronic semiconductor component comprising:
a plurality of optoelectronic semiconductor chips located on a common mounting surface; and
an optical element arranged downstream of the semiconductor chips in a main emission direction and spaced from the semiconductor chips;
wherein the optical element has a transmission gradient in a transitional region in a direction transverse to the main emission direction and wherein the transitional region does not overlap the semiconductor chips when viewed in plan view onto the mounting surface; and
wherein the optical element comprises a stop, wherein the following applies for an average stop opening diameter D and for an average width H of the transitional region: $4 \leq D/H \leq 40$.

20. An optoelectronic semiconductor component comprising:
a plurality of optoelectronic semiconductor chips located on a common mounting surface; and
an optical element arranged downstream of the semiconductor chips in a main emission direction and spaced from the semiconductor chips;
wherein the optical element has a transmission gradient in a transitional region in a direction transverse to the main emission direction and wherein the transitional region does not overlap the semiconductor chips when viewed in plan view onto the mounting surface; and
wherein the transmittance of the optical element decreases in the transitional region in a linear manner towards the outside.

21. An optoelectronic semiconductor component comprising:
a plurality of optoelectronic semiconductor chips located on a common mounting surface; and
an optical element arranged downstream of the semiconductor chips in a main emission direction and spaced from the semiconductor chips;
wherein the optical element has a transmission gradient in a transitional region in a direction transverse to the main emission direction and wherein the transitional region does not overlap the semiconductor chips when viewed in plan view onto the mounting surface; and
wherein a transmittance of the optical element decreases in a stepped manner in the transitional region, the transitional region comprising a plurality of transmittance steps and the transmittance of adjacent steps differing by at most 20 percentage points.

22. An optoelectronic semiconductor component comprising:
a plurality of optoelectronic semiconductor chips located on a common mounting surface; and
an optical element arranged downstream of the semiconductor chips in a main emission direction and spaced from the semiconductor chips;
wherein the optical element has a transmission gradient in a transitional region in a direction transverse to the main emission direction and wherein the transitional region does not overlap the semiconductor chips when viewed in plan view onto the mounting surface; and
wherein the transitional region, when viewed in plan view, comprises triangular teeth with a transmittance of at most 20%, wherein the width of each of the teeth increases towards the outside.

23. An optoelectronic semiconductor component comprising:
- a plurality of optoelectronic semiconductor chips located on a common mounting surface; and
- an optical element arranged downstream of the semiconductor chips in a main emission direction and spaced from the semiconductor chips;
- wherein the optical element has a transmission gradient in a transitional region in a direction transverse to the main emission direction and wherein the transitional region does not overlap the semiconductor chips when viewed in plan view onto the mounting surface;
- wherein the transmission gradient is dependent on a wavelength of radiation emitted by the semiconductor chips; and
- wherein the semiconductor chips emit in at least two different wavelength ranges when in operation.

* * * * *